US 9,000,854 B1

(12) United States Patent
Mohanty (10) Patent No.: US 9,000,854 B1
(45) Date of Patent: Apr. 7, 2015

(54) TIMING OSCILLATOR HAVING A NON-LINEAR MEMS RESONATOR AND RELATED METHODS

(71) Applicant: Sand 9, Inc., Cambridge, MA (US)

(72) Inventor: Pritiraj Mohanty, Los Angeles, CA (US)

(73) Assignee: Sand 9, Inc., Cambridge, MA (US)

( * ) Notice: Subject to any disclaimer, the term of this patent is extended or adjusted under 35 U.S.C. 154(b) by 64 days.

(21) Appl. No.: 13/661,663

(22) Filed: Oct. 26, 2012

Related U.S. Application Data

(60) Provisional application No. 61/552,531, filed on Oct. 28, 2011.

(51) Int. Cl.
*H03B 5/32* (2006.01)
*H03B 1/04* (2006.01)
*H03B 5/30* (2006.01)

(52) U.S. Cl.
CPC .. *H03B 1/04* (2013.01); *H03B 5/30* (2013.01); *H03B 5/32* (2013.01)

(58) Field of Classification Search
USPC ................. 331/158, 182, 176, 156, 116 R
See application file for complete search history.

(56) References Cited

U.S. PATENT DOCUMENTS

| 8,058,769 | B2 | 11/2011 | Kuypers |
| 8,378,758 | B2 * | 2/2013 | Villanueva Torrijo et al. ............... 331/156 |
| 2010/0314969 | A1 | 12/2010 | Gaidarzhy |
| 2010/0315170 | A1 | 12/2010 | Locascio |

OTHER PUBLICATIONS

Dunn, T., "Nonlinear dynamics in micromechanical and nanomechanical resonators and oscillators," Ph.D. thesis, Boston University; 3500337 (2012).
Greywall, D.S. et al. "Evading Amplifier Noise in Nonlinear Oscillators", Phys. Rev. Lett. 72, 2992 (1994).
Kaajakari, V. et al. "Phase noise in capacitively coupled micromechanical oscillators," IEEE Trans. Ultrason., Ferroelectr., Freq. Control, vol. 52, No. 12, pp. 2322-2331, Dec. 2005.
Kuypers, J.H. et al, "High Performance MEMS Oscillators for Communications Applications", Fourth International Symposium on Acoustic Wave Devices for Future Mobile Communication Systems, Chiba, Japan, Presented Mar. 4, 2010.
Nguyen, C.T.-C. "MEMS technology for timing and frequency control," IEEE Trans. Ultrason., Ferroelectr., Freq. Control, vol. 54, No. 2, pp. 251-270, Feb. 2007.
Schoepf et al., "TCMO™: A Versatile MEMS Oscillator Timing Platform," 41$^{st}$ Annual Precise Time and Time Interval (PTTI) Systems and Applications Meeting, Santa Ana Pueblo, New Mexico, presented Nov. 19, 2009, 12 pages.

* cited by examiner

*Primary Examiner* — Joseph Chang
(74) *Attorney, Agent, or Firm* — Wolf, Greenfield & Sacks, P.C.

(57) ABSTRACT

Oscillators including mechanical resonators are described, as are methods of operating the oscillators such that the mechanical resonator exhibits non-linear behavior. The non-linear behavior may include multiple stable states, for instance being bi-stable. The non-linear behavior may exhibit hysteresis. The mechanical resonator may be driven to operate in a desired portion of the non-linear operating regime.

25 Claims, 5 Drawing Sheets

TIMING OSCILLATOR HAVING A NON-LINEAR MEMS RESONATOR AND RELATED METHODS

RELATED APPLICATIONS

This application claims the benefit under 35 U.S.C. §119 (e) of U.S. Provisional Patent Application Ser. No. 61/552,531, filed on Oct. 28, 2011 and entitled "TIMING OSCILLATOR HAVING A NON-LINEAR MEMS RESONATOR AND RELATED METHODS", which application is hereby incorporated herein by reference in its entirety.

BACKGROUND

With ever more stringent demands placed upon the size, speed and power consumption of modern electronics, microelectromechanical systems (MEMS) are emerging as an attractive alternative to quartz crystals for applications requiring high performance timing signals and frequency references. Traditional (often competing) objectives in building oscillators based on these systems include minimizing external sources of noise (e.g. from sustaining circuitry), increasing quality factor Q and maximizing the power-handling capability of the resonator.

Conventional oscillators which use mechanical resonators do so by operating the mechanical resonator in a linear regime. Conventional wisdom dictates that nonlinearity is detrimental to oscillator performance. In addition to generating unwanted harmonics and providing the potential for chaotic operation, nonlinearity leads to mixing of 1/f-type noise onto the high frequency signal, degrading near-carrier phase noise.

SUMMARY

According to an aspect of the present application, a method of operating a timing oscillator is provided. The timing oscillator may include a mechanical resonator, and the method comprises driving the mechanical resonator such that the mechanical resonator operates in a non-linear regime.

According to an aspect of the present application, a timing oscillator is provided. The timing oscillator may comprise a mechanical resonator, and a drive circuit configured to provide an input signal to drive the mechanical resonator in a non-linear regime.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Applicants have appreciated that oscillators may utilize mechanical resonators operating in a non-linear regime beneficially. As the driving force of the resonator is increased, the resonator stiffens or softens, and its response becomes asymmetric and ultimately bi-stable. Importantly, the phase exhibits an increasingly steep slope prior to the bifurcation, and this steepness may increase the stability of the operation point. Also, amplifier noise can be evaded, and the change in frequency resulting from phase diffusion may be decreased. Thus, Applicants have appreciated that, contrary to conventional wisdom, non-linear operation of a mechanical resonator in an oscillator may be beneficial.

According to an aspect of the present technology, a method is provided for operating a timing oscillator that involves driving a mechanical resonator of the timing oscillator suitably to have the mechanical resonator operate in a non-linear regime. In some embodiments, the non-linear regime may be characterized by the resonator exhibiting displacement or vibration of a magnitude that is non-linearly related to the input force applied to the resonator. In some embodiments, the non-linear regime may be marked by the presence of two or more states (e.g., bi-stable operation). Non-limiting examples are described further below, for example with respect to FIG. 2.

According to an aspect of the present technology, a timing oscillator may include a mechanical resonator and may be configured to operate the mechanical resonator in a non-linear regime. In some embodiments, the timing oscillator may include a drive circuit configured to apply a suitable drive signal to the mechanical resonator (e.g., as an input signal to the mechanical resonator) to cause the mechanical resonator to operate in the non-linear regime.

The aspects described above as well as further aspects are described below in detail. The aspects may be used individually or in any combination of two or more. All such combinations are contemplated and are part of this disclosure.

Figure 1:
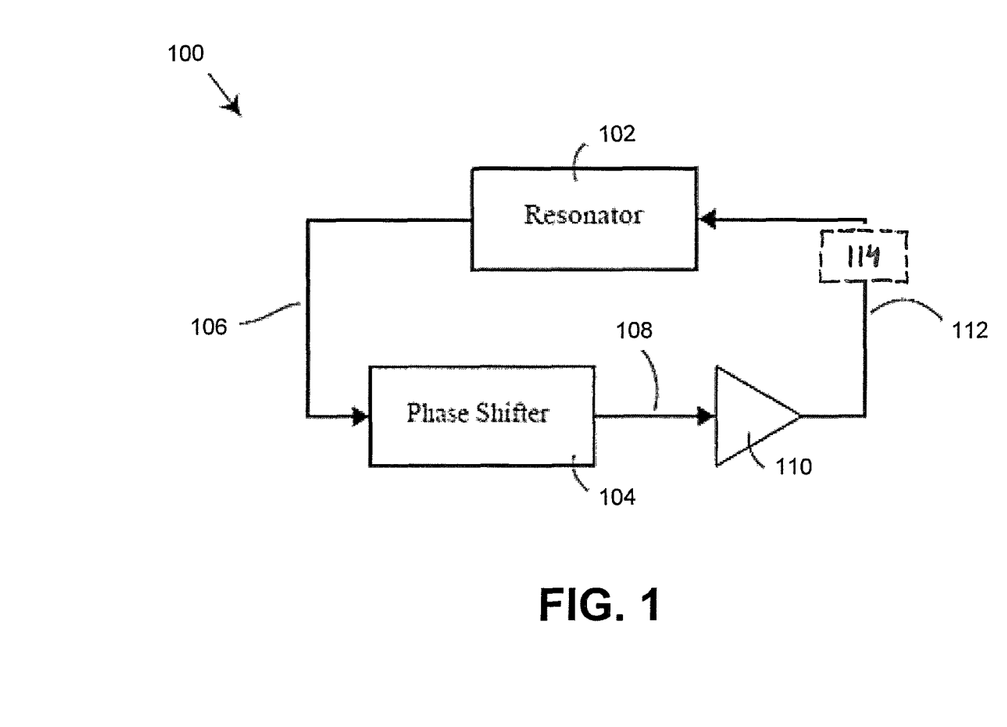
FIG. 1 schematic illustration of an exemplary timing oscillator comprising a mechanical resonator, according to a non-limiting embodiment.

FIG. 1 illustrates a non-limiting example of a timing oscillator to which various aspects of the present application may apply. The timing oscillator 100 may comprise a mechanical resonator 102 and a phase shifter 104, configured in a feedback circuit.

The mechanical resonator 102 may be any type of mechanical resonator, such as a microelectromechanical system (MEMS) resonator, a nanoelectromechanical system (NEMS) resonator, a bulk acoustic wave (BAW) resonator, a surface acoustic wave (SAW) resonator, a film bulk acoustic resonator (FBAR), or any other suitable resonator, as the various aspects described herein are not limited in this respect.

In some embodiments, the mechanical resonator 102 and/or the timing oscillator 100 including the mechanical resonator 102 may be formed of two of more materials, for example using two or more material layers. Thus, the operation and resonance frequency of the mechanical resonator 102 and/or the timing oscillator 100 in these embodiments may vary due to material-dependent stresses, for example those stresses arising due to the use of materials having different expansion coefficients. However, not all embodiments are limited in this respect. Moreover, the mechanical resonator 102 may be actuated and/or detected in any suitable manner, including, but not limited to, being actuated and/or detected by piezoelectric techniques, electrostatic techniques, magnetic techniques, thermal techniques, piezoresistive techniques, any combination of those techniques listed, or in any other suitable manner.

Similarly, the phase shifter 104 may be any suitable type of phase shifter for receiving an input signal and producing an output signal having a phase shifted relative to that of the input signal. It should be appreciated that phase shifter 104 may be a variable phase shifter according to some embodiments, such that the amount of phase shift provided by the phase shifter 104 may be varied.

With respect to FIG. 1, the mechanical resonator 102 may produce an output signal 106, having a phase, which output signal may be input to the phase shifter 104. The phase shifter 104, upon receiving the output signal 106 of the mechanical resonator 102, may shift the phase of the output signal 106 and produce a phase-shifted output signal 108. The phase-shifted output signal 108 may be identical to the resonator output signal 106, except for having a different phase. However, the various aspects described herein are not limited in this respect.

According to some embodiments, a gain factor is applied in the feedback circuit of timing oscillator 100. In the non-limiting example of FIG. 1, an amplifier 110 is included to provide gain, and may have any suitable gain factor. The amplifier 110 receives the phase-shifted output signal 108, and produces an amplified output signal 112, which is then provided to an input of the mechanical resonator 102 as part of a feedback signal. Thus, in some embodiments, the signal provided to the input of the mechanical resonator 102 may differ from the output of the mechanical resonator in both phase and magnitude, although not all embodiments are limited in this respect.

It should be appreciated that the inclusion and configuration of amplifier 110 for providing gain is subject to variation, and may not be included in all embodiments. For example, a gain stage could alternatively be provided in front of the phase shifter 104 (as opposed to behind the phase shifter 104), to operate directly on the output signal of the mechanical resonator 102. Alternatively, a gain stage may be implemented as part of the phase shifter 104, rather than as a distinct element. Other configurations are also possible, and the various aspects described herein are not limited to using any particular type or configuration of gain element.

In operation, if the total amount of phase shift provided by the phase shifter 104 is greater than, for example, 180 degrees, the timing oscillator 100 may exhibit resonance at a frequency greater than the series resonance frequency of the mechanical resonator 102. If the total amount of phase shift provided by the phase shifter 104 is less than, for example, 180 degrees, the timing oscillator 100 may exhibit resonance at a frequency lower than the series resonance frequency of the mechanical resonator 102. Thus, by varying the amount of phase shift provided by the phase shifter 104, the timing oscillator 100 may be tuned on both sides of the series resonance peak of the mechanical resonator 102.

Furthermore, in some embodiments, the feedback circuit may further comprise an option limiter 114 configured to limit an amplitude of the feedback signal to a limiting value. In the illustrated embodiment, the limiter 114 is shown as a distinct component. However, not all embodiments are limited in this manner. For example, the limiter may be implemented as part of the amplifier 110 in some embodiments. Regardless of the exact implementation of the limiter, the feedback signal may be limited in amplitude such that stable signals are maintained throughout the feedback circuit, e.g., such that the timing oscillator provides self-sustained oscillation.

The phase shifter 104 may be configured to set a phase of the feedback signal in some embodiments, such that the output signal 106 of the mechanical resonator 102 exhibits self-sustained oscillations. For example, the phase of the feedback signal may be fixed in relation to a phase of the input signal of the mechanical resonator 102. In some embodiments, the limiter 114 may be configured to limit the amplitude of the feedback signal to a particular value which, given a phase set by the phase shifter 104, may ensure self-sustained oscillation of the timing oscillation 100. In some embodiments, a relative phase difference between the input signal of the mechanical resonator 102 and the feedback signal may be configured to be zero degrees or 360 degrees (or some integer multiple thereof), such that the two signals are exactly in-phase with each other.

It should be appreciated, however, that the relative phase difference between the input signal of the mechanical resonator 102 and the feedback signal may not necessarily be in phase, and may be arbitrary. In such scenarios, the limiter may be configured to appropriately compensate for any additional losses in the output signal 106. Regardless of the exact nature of the phase shift and the limiting value (the value to which the limiter 114 limits the amplitude of the feedback signal), it should be appreciated that a feedback circuit may be configured to shift a phase and limit an amplitude of the feedback signal suitably to ensure self-sustaining oscillations are provided as the output signal 106 of the resonator mechanical 102.

It should also be appreciated that a feedback circuit of a timing oscillator may include other components suitable for providing gain to and/or driving a mechanical resonator for use in a timing oscillator. For example, in some embodiments, the feedback circuit may be configured to provide a bias signal that drives the mechanical resonator. Such a bias signal may be in addition, or an alternative to, other signals that are input to the mechanical resonator. Such signals may be combined into an input signal that drives the mechanical resonator in a non-linear regime of operation.

When a mechanical resonator 102 is driven with an input signal having an amplitude that exceeds a critical amplitude, the output signal 106 may become a non-linear function of the input signal. The mechanical resonator 102 may exhibit vibration having an amplitude that is a non-linear function of the input force (e.g., the input signal) used to drive the mechanical resonator. The resonator 102 may then operate in a non-linear regime. In some embodiments, the non-linear regime may comprise a range of input signal amplitudes for which two or more stable amplitudes and phases of oscillation exist at a given input frequency. This multi-stability may arise as the result of forces acting on the resonator which are proportional to the amplitude cubed (or other higher-orders of amplitude), as described, for example, by the Duffing model. In sweeps of input frequency or input amplitude, the amplitude and phase of an output signal of the resonator may exhibit hysteretic behavior, jumping between the stable states at one of two bifurcation points. In such situations, the resonator may be operate at a desired point of the hysteresis curve. For example, a given branch of the hysteresis curve may correspond to more stable frequency behavior (i.e., lower phase noise) of the oscillator, and thus may be chosen as the operating region in which to operate the mechanical resonator.

In specific nonlinear regimes, a resonator (e.g., a microelectromechanical systems (MEMS) resonator) may have sharp and asymmetric responses to an applied drive or an applied strain. In some embodiments, nonlinear behavior may result from material nonlinearity of the resonator. In some embodiments, the frequency dependence of the response (amplitude of displacement or strain) in the nonlinear regime is a multivalued function indicating the stable and unstable regions of operation. The nonlinear resonator behavior may also exhibit hysteresis and multi-stable states.

Figure 2:
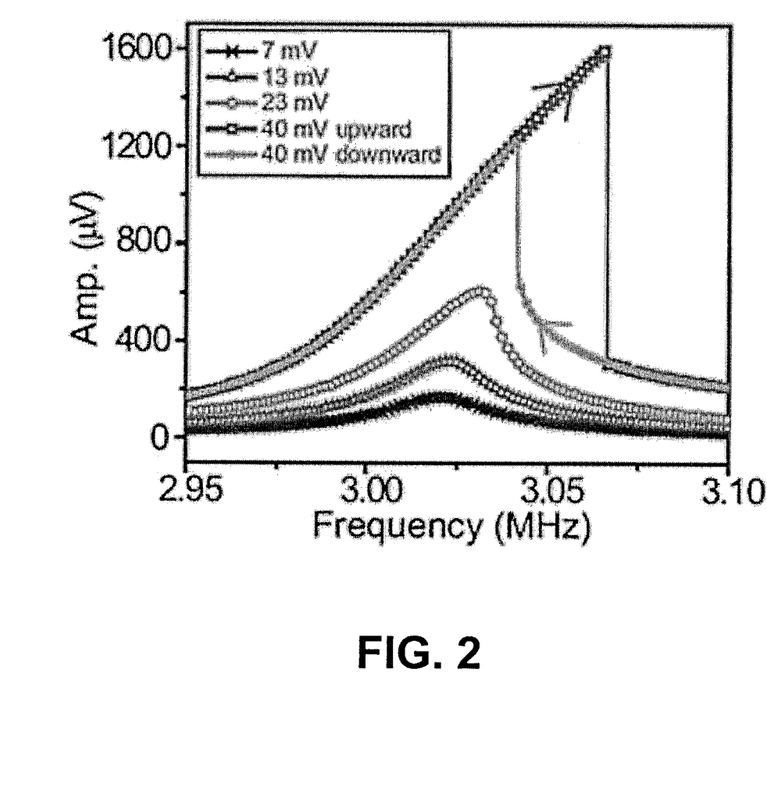
FIG. 2 is an exemplary graph of transmission gain as a function of drive frequency for a timing oscillator operating in linear and non-linear regimes, according to a non-limiting embodiment.

FIG. 2 illustrates the operating behavior of a timing oscillator in both linear and non-linear regimes depending on the magnitude of a drive signal. In particular, FIG. 2 is a graph of transmission measurements relating to oscillator operation, with the x-axis representing frequency (in MHz) and the y-axis representing the amplitude of the drive signal (or input signal) used to drive the mechanical resonator of the oscillator, in units of µV. Curves for four different driving amplitudes are shown, namely 7 mV, 13 mV, 23 mV, and 40 mV. In all cases, the timing oscillator is subject to a direct current (DC) bias of 17 V.

For small input signals, such as input amplitudes of 7 mV and 13 mV, the frequency response of the timing oscillator exhibits an expected symmetric (Lorentzian) line shape around a central resonance frequency (approximately 3.02 MHz in FIG. 2). As the amplitude of the input signal is increased, the timing oscillator exhibits non-linear behavior. As a non-limiting example, the curve in FIG. 2 corresponding to an input amplitude of 40 mV shows non-linear behavior. As shown, the response curve corresponding to an input amplitude of 40 mV exhibits hysteresis, with an "upward" branch and a "downward" branch, as indicated by the arrows. In general, a non-linear regime of operation may result from driving a resonator with an input signal having an amplitude greater than a critical amplitude. The curve in FIG. 2 corresponding to an input amplitude of 23 mV is also non-linear.

Non-linear operation may have at least two effects on the response of a timing oscillator: asymmetry and hysteresis. The first effect is that the response curve may no longer have a symmetric Lorentzian shape, as shown in FIG. 2 with respect to the 40 mV curve. In some embodiments, the response may lean to one side (for example, leaning to the right in the curve for 40 mV in FIG. 2) as the central resonance frequency shifts to increasing values.

Alternatively, the curve may lean to the left as the central frequency decreases. Whether the response curve shifts and leans to the left or to the right may depend on whether the non-linearity corresponds to "softening" or "stiffening," respectively. It should be appreciated that embodiments described herein may be used for either case, and that subsequent discussions may be applied to timing oscillators with either right-leaning or left-leaning response curves.

A stiffening effect may cause the resonance frequency of a mechanical resonator to increase and eventually multiple stable amplitude states may emerge. For example, in FIG. 2, at an input signal amplitude of 40 mV, there are two possible states for the response (an upper state and a lower state) over a frequency band of approximately 25 kHz, ranging from 3.04 MHz to 3.065 MHz. In the middle portion of the two-state region, transitions between the upper and lower states may not easily be accomplished by applying small input changes, corresponding to a double-well potential bather. As a result, the two states may be relatively stable and the bi-stable amplitude states may provide two stable modes of operation for an oscillator.

A second effect of operating a resonator in a nonlinear regime is called hysteresis. In the example curve corresponding to an input amplitude of 40 mV in FIG. 2, the oscillator may enter the upper state if the drive frequency starts below the lower end point of the bi-stable region (approximately 3.04 MHz in the example of FIG. 2) and increases above the lower end point. Alternatively, the oscillator may enter the lower state if the drive frequency starts above the upper end point of the bi-stable region (approximately 3.065 MHz in FIG. 2) and decreases below the upper end point. This effect of the oscillator having "memory" of an initial condition is referred to as hysteresis.

If the oscillator is driven to operate at one of the two endpoints of the hysteresis region, then a small perturbation may cause a large response, either jumping upwards or downwards. In the example of FIG. 2, if the oscillator is driven with a 40-mV input at a frequency of 3.065 MHz, then a slight change in frequency or resonator characteristics may give rise to a huge change in response, with the output amplitude falling from approximately 1600 µV down to approximately 300 µV.

Therefore, near the end points of the hysteresis region, a timing oscillator may exhibit heightened sensitivity to noise and other external signals, and may jump between stable states. In some embodiments, such sensitivity may be leveraged in sensors and detectors to amplify small signals by configuring an oscillator to operate close to this dynamic instability.

Furthermore, in some embodiments, the mechanical resonator may be configured such that the middle portion of the hysteresis region (ranging from 3.04 MHz to 3.065 MHz in the non-limiting example of FIG. 2) is substantially flat, horizontal to the x-axis. This may be desirable, for example, in a timing oscillator to provide an amplitude of oscillation that is robust to internal or external fluctuations.

External fluctuations may be caused by various sources. For example, ambient temperature changes, fluctuating drive input, noise in surrounding circuitry or packaging may represent external fluctuations. Intrinsic fluctuations may be caused, for example, by noise in the mechanical resonator itself, such as 1/f-type noise, fluctuations in the material itself, or between material interfaces.

In a linear-operating oscillator, such external or internal fluctuations may cause significant changes in output amplitude. For example, if a linearly-operating oscillator is configured to operate at its resonant peak (e.g., at 3.02 MHz for the 13 mV input in FIG. 2), then a small change in drive frequency, either left or right from the peak, may cause a change in output amplitude, which may have significant impact in some applications of a timing oscillator.

However, in the non-linear regime, if the mechanical resonator is configured to have a flat response in the hysteresis region, then operating the oscillator in the middle of the hysteresis region will provide an output oscillation amplitude that is more robust to noise or fluctuations. As a non-limiting example, in some embodiments, the response in the hysteresis region may be configured such that a displacement resulting from a fluctuation is 100 times smaller than a displacement to the same fluctuation in linear operation.

The sharp features of the frequency dependence are contrasted by a well-behaved single-valued frequency as a function of the phase. For sustained oscillation, phase is used as the parameter to be used in the feedback circuit to satisfy the gain and phase requirements. Therefore, the frequency that the resonator oscillates at can be defined by tuning the phase of, for example, the amplifier of the oscillator to an appropriate value. In the nonlinear regime, the frequency of operation can be higher than the corresponding resonance frequency in the linear regime.

In general, operating the oscillator in the nonlinear regime can allow very little frequency jitter (i.e., may prevent frequency jitter or substantially prevent frequency jitter) around the operation frequency while providing a fixed phase. The main reason is the rigidity of the resonator in the nonlinear regime as it resides in one of the multivalued states. Once the frequency and the phase conditions for the amplifier are set, the resonator will be forced to oscillate at a single frequency without unwanted excursions to the nearby frequencies. In contrast, a linear resonator with finite quality factor has a natural bandwidth within which frequency excursion can easily occur.

By appropriately controlling the parameters of a mechanical resonator, a nonlinear response of the resonator may be utilized to provide beneficial operation of an oscillator that is not typically possible with linear components. For example, in some embodiments, in addition to providing stability and robustness of amplitude response, a timing oscillator may be configured to operate in a nonlinear regime to provide stability of output frequency and output phase, and to reduce phase noise.

Figure 3A:
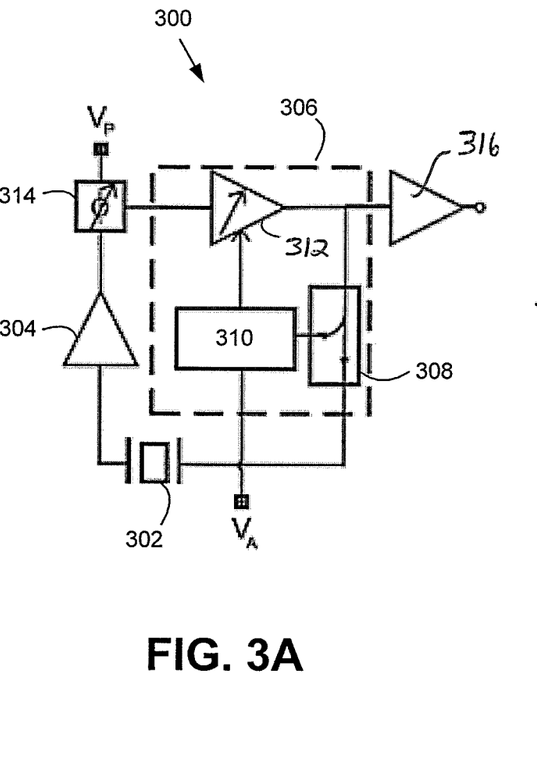
FIG. 3A is a detailed schematic illustration of a timing oscillator comprising a mechanical resonator, according to a non-limiting embodiment.

FIG. 3A illustrates a design of an exemplary timing oscillator 300 comprising a resonator 302 and an amplifier 304. In this context, the resonator 302 represents the generalized frequency selective portion of the oscillator 300. In addition to the actual mechanical resonator, the resonator 302 may comprise additional passive components which facilitate oscillation at the desired frequency. However, if the resonator 302 is dissipative, then the output arising from noise-induced fluctuation alone may have insufficient signal-to-noise ratio for the purposes of timing. Thus, a feedback loop may be provided with an active element (e.g., amplifier 304) to reinforce oscillation of the system at a chosen frequency.

It should be appreciated that additional features (some of which may not be visible in FIG. 3A) of the timing oscillator 300 may facilitate a steady state oscillation at the output of the resonator 302. In some embodiments, the oscillator 300 may incorporate techniques for varying the steady-state amplitude of oscillation at the output of resonator 302. Amplitude tuning may be achieved, for example, using a trimmer potentiometer in front of the resonator 302. Alternatively or additionally, the components enclosed in the dashed box 306 of FIG. 3A may implement a scheme for automatic level control.

In FIG. 3A, the timing oscillator 300 may be tunable in both phase and amplitude. In this example, the oscillator 300 comprises two stages of gain, the first stage comprising the amplifier 304 and the second stage comprising the dashed box 306 representing an automatic level control circuit. The directional coupler 308 may send a small portion of the feedback signal to a logarithmic detector 310, which may control a variable gain amplifier (VGA) 312 via negative feedback to maintain a desired amplitude level set by voltage $V_A$. A voltage $V_P$ may be used to set the phase of the feedback signal with a phase shifter 314. A buffer amplifier 316 may optionally be included, for example to provide an output signal.

Figure 3B:
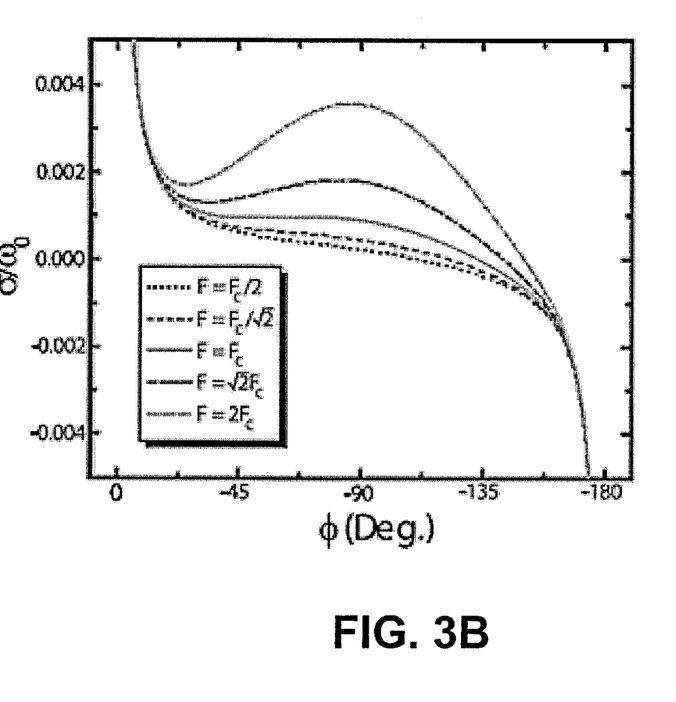
FIG. 3B is a graph of detuning frequency as a function of oscillation phase for a timing oscillator operating in linear and non-linear regimes, according to a non-limiting embodiment.

The timing oscillator 300 may be tunable in both amplitude and phase so that operating points both above and below a critical amplitude of the resonator 302 can be controllably set. In some embodiments, a frequency of an output signal of the resonator 302, as a function of phase, may be a single-valued function. An example is illustrated in FIG. 3B, which is a graph of detuning frequency $\sigma$ (represented on the y-axis as a normalized value $\sigma/\phi_o$) as a function of phase $\phi$ (in units of degrees on the x-axis) of the output signal of a resonator, such as resonator 302 in FIG. 3A. The detuning frequency $\sigma$ is equal to the difference between the operating frequency of the resonator output signal and a central resonant frequency. Curves for five different driving forces "F" are shown. $F_c$ is the critical driving force above which the transition from linear to non-linear behavior occurs.

In the example curves of FIG. 3B, each value of phase has a corresponding single value of detuning frequency, and therefore fixing a phase also fixes a frequency of oscillation in the mechanical resonator. In some embodiments, a phase shifter (e.g., phase shifter 104 in FIG. 1 or phase shifter 314 in FIG. 3A) may be used to move the phase of a resonator's output signal controllably through the nonlinear regime and to set a frequency which enables stable self-sustained oscillations at the output of the resonator.

Figure 4:
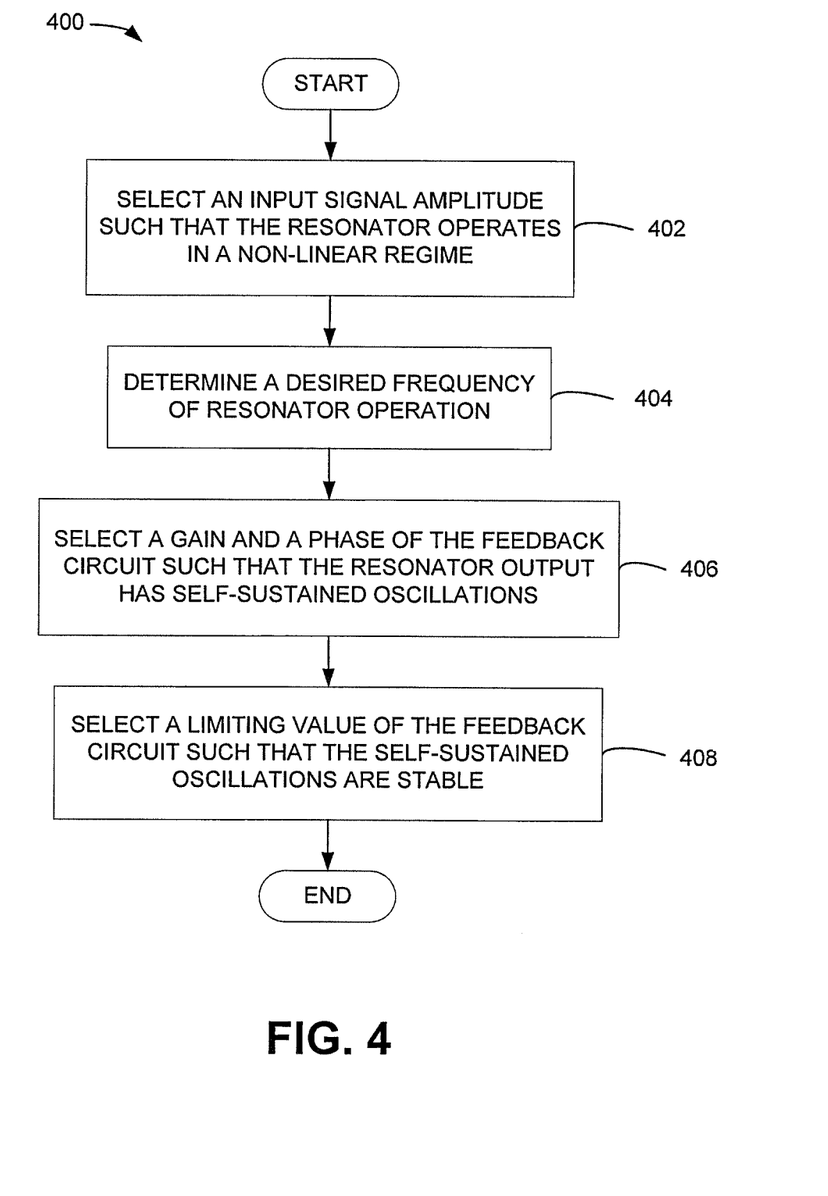
FIG. 4 is a flowchart of a method of setting parameters in a timing oscillator operating in a non-linear regime, according to a non-limiting embodiment.

FIG. 4 is a flow chart of an exemplary process 400 of setting parameters in a timing oscillator such that the oscillator operates in a nonlinear regime. Prior to the start of process 400, a mechanical resonator (e.g., mechanical resonator 102 in FIG. 1 or mechanical resonator 302 in FIG. 3) may be configured in a feedback circuit as part of a timing oscillator. In some embodiments, the feedback circuit may comprise at least an amplifier, a phase shifter, and a limiter.

Based on the properties of the mechanical resonator, in step 402, an amplitude of an input signal to the mechanical resonator may be determined to drive the resonator to operate in a non-linear regime. In some embodiments, if the resonator has a critical amplitude above which it operates in a non-linear regime, then the amplitude of the input signal may be set to a value greater than the critical amplitude.

Once an input amplitude has been determined to drive the resonator in a nonlinear regime, then in step 404 a desired frequency of operation may be set for the timing oscillator. In some embodiments, the frequency may be selected to be in the middle of a range of frequencies in which an amplitude of an output signal of the resonator corresponds to one of multiple stable states, and in which a response of the oscillator has a substantially flat hysteresis region. Yet, it should be appreciated that other values of frequency may be selected, either corresponding to an edge of the hysteresis region (e.g., in sensor applications), or outside of the hysteresis region altogether, so that the resonator operates in a state not corresponding to one of multiple stable states.

The selected frequency may, in some embodiments, determine the frequency of an input signal that drives the mechanical resonator. As a non-limiting example, the frequency may be set within a range of 1 MHz to 10 GHz. It should be appreciated, however, that techniques described herein are not limited to any particular range of operating frequency.

Having configured the timing oscillator with a sufficiently large input amplitude to drive a mechanical resonator in a non-linear regime, and having selected a frequency of the input signal to fix an operating point of the oscillator, then in step 406 the gain and phase of the feedback circuit may be configured such that the oscillation at the output of the resonator does not decay and is self-sustaining.

In step 408, the feedback circuit may be further configured to limit the feedback signal such that the self-sustained oscillations are stable, and do not grow indefinitely. The limiting function may be implemented either in an amplifier of the feedback circuit, or in a separate limiter, as non-limiting examples. Regardless of the exact nature of the limiting function, the feedback circuit may be configured to provide a feedback signal with a phase and an amplitude that enables stable and self-sustaining oscillations at the output of a mechanical resonator.

The various aspects described herein are not limited to use with any particular type of mechanical resonator. Yet, for purposes of illustration, FIGS. 5A and 5B illustrate a perspective view and a cross-sectional view, respectively, of a mechanical resonator as may be used according to various aspects described herein.

Figure 5A:
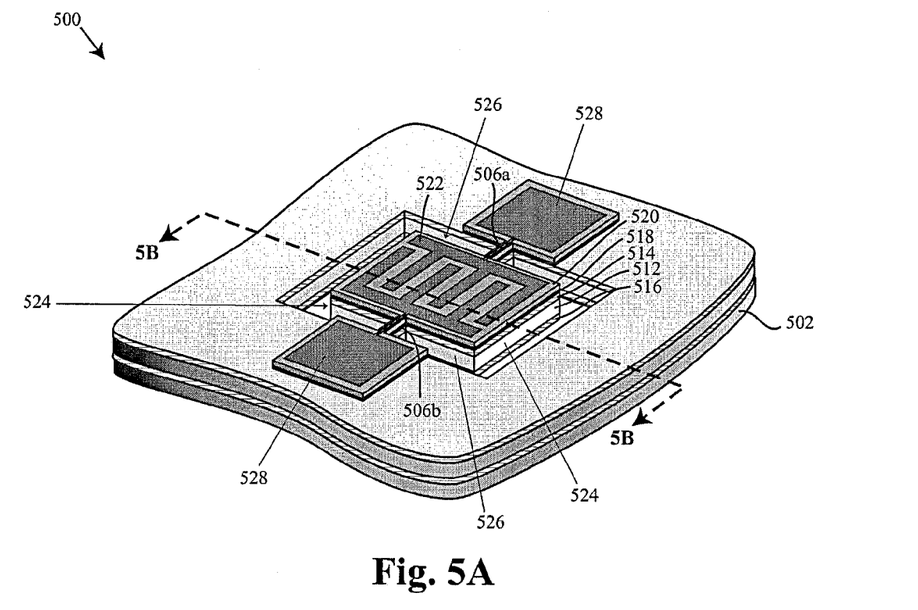
FIG. 5A is a schematic illustration of a perspective view of a mechanical resonator, according to a non-limiting embodiment.
Figure 5B:
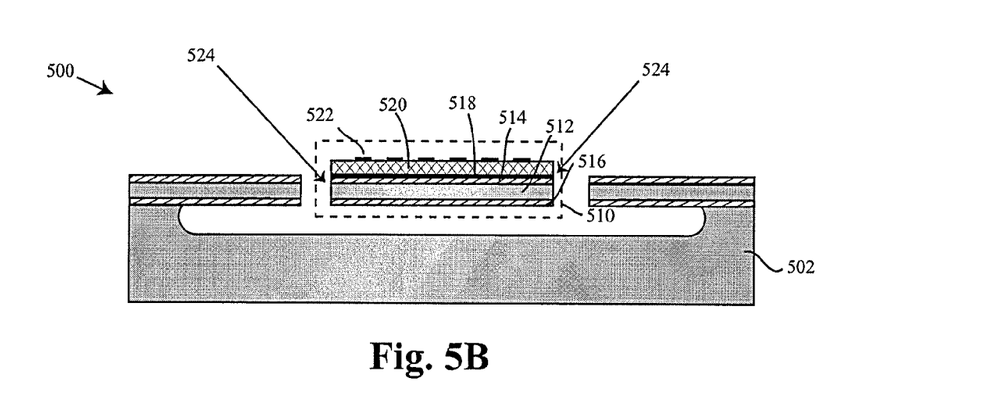
FIG. 5B is a schematic illustration of a cross-sectional view of a mechanical resonator, according to a non-limiting embodiment.

FIGS. 5A and 5B provide a perspective view and a more detailed cross-sectional view, respectively, of a device 500 including a micromechanical resonating structure 510 (reference number shown in FIG. 5B). As illustrated, the micromechanical resonating structure 510 may include an active layer 520 (e.g., a piezoelectric layer, for example made of aluminum nitride, or any other suitable piezoelectric material), a conducting layer 518 (e.g., a metal electrode), and one or more electrodes 522 (which may, in some embodiments be configured as top electrodes). A contact pad 528 may provide electrical access to the electrodes 522. The conducting layer 518 may, in some embodiments, be configured as an electrode, and may therefore in some embodiments be considered a bottom electrode. Electrical access to the conducting layer may be provided by a portion of the conducting layer located below the contact pad 528. For example, the portion of the conducting layer located below the contact pad 528 may be made larger than the contact pad 528, allowing for separate electrical contact to be made to the contact pad 528 and the portion of the conducting layer 518 located below the contact pad. Alternatively, a separate contact pad (e.g., next to contact pad 528 or in any other suitable location) may provide electrical access to the conducting layer 518. Other alternatives are also possible. The active layer 520 may be actuated by applying a voltage/electric field thereto using electrodes 522 (formed, for example, of a metal) and bottom conducting layer 518, which in some embodiments may be configured as a ground plane. Not all the illustrated components are required and other components may be included in some embodiments, as the illustration provides a non-limiting example of a mechanical resonating structure.

The micromechanical resonating structure 510 also includes a silicon layer 512, a silicon oxide layer 514 on the top surface of the silicon layer 512, and a silicon oxide layer 516 on the bottom surface of the silicon layer 512. The combination of silicon layer 512 and silicon oxide layers 514 and 516 may operate as a temperature compensation structure (a temperature compensation stack in this configuration) to compensate temperature-induced changes in the frequency of operation of micromechanical resonating structure 510, as described further below. It should be appreciated that the silicon layer 512 may be formed of any suitable semiconductor material, and that silicon is a non-limiting example described herein for purposes of illustration. Non-limiting alternatives include germanium, gallium arsenide, or other semiconductor materials. Thus, the use of silicon for layer 512 is not limiting. Similarly, layers 514 and 516 may be formed of any suitable material (e.g., other types of oxide than silicon oxide), as silicon oxide is a non-limiting example described herein for purposes of illustration. Also, as mentioned, not all the illustrated components are required and other components may be included in some embodiments, as the illustration provides a non-limiting example of a mechanical resonating structure.

The micromechanical resonating structure may be connected to a substrate 502 by two or more anchors. As shown in FIG. 5A, the micromechanical resonating structure 510 is connected to the substrate 502 by two anchors, 506a and 506b, which may be flexible in some embodiments. The number of anchors is not limiting, as any suitable number may be used. It should further be understood that the geometry of the anchors may be matched to a specific length to reduce the amount of acoustic energy transferred from the micromechanical resonating structure to the substrate. Suitable anchor structures that reduce stress and inhibit energy loss have been described in U.S. patent application Ser. No. 12/732,575, filed Mar. 26, 2010, published as U.S. Patent Publication No. 2010/0314969 and entitled "Mechanical Resonating Structures and Methods", which is hereby incorporated herein by reference in its entirety.

As mentioned, various types and forms of mechanical resonating structures may be used with the aspects of the present application, and FIGS. 5A and 5B provide only a non-limiting example. For example, the mechanical resonating structure may comprise or be formed of any suitable material(s) and may have any composition. According to some embodiments, the mechanical resonating structure may comprise a piezoelectric material (e.g., active layer 520). According to some embodiments, the mechanical resonating structure comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments in which the mechanical resonating structure comprises a piezoelectric material, the piezoelectric material may be single crystal material, although in other embodiments including a piezoelectric material the piezoelectric material may be polycrystalline.

The mechanical resonating structure may have any shape, as the shape illustrated in FIGS. 5A and 5B is a non-limiting example. For example, aspects of the technology may apply to mechanical resonating structures that are substantially rectangular, substantially ring-shaped, substantially disc-shaped, or that have any other suitable shape. As additional, non-limiting examples, the configuration of the mechanical resonating structure can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. Moreover, the mechanical resonating structure may have one or more beveled edges. According to some embodiments, the mechanical resonating structure may be substantially planar. Moreover, geometrical and structural alterations can be made to improve quality (e.g., Q-factor, noise) of a signal generated by the mechanical resonating structure.

The mechanical resonating structures described herein may have any suitable dimensions, and in some embodiments may be micromechanical resonating structures. A mechanical resonating structure may have any suitable thickness, T, and in some embodiments the thickness may be related to a wavelength of a desired oscillation mode. According to a non-limiting embodiment, the thickness T may be less than $2\lambda$, less than $\lambda$, less than $\frac{1}{2}\lambda$, less than $\frac{1}{4}\lambda$, less than $\frac{1}{6}\lambda$, or any other suitable value, where $\lambda$ is a wavelength of operation of the mechanical resonating structure (e.g., a wavelength of a resonance mode of interest of a mechanical resonating structure, an acoustic wavelength of a Lamb wave of interest, etc.). According to a non-limiting embodiment, the mechanical resonating structure may be configured to support Lamb waves, and T may be less than 2λ, less than ½λ, or have any other suitable According to some embodiments, the mechanical resonating structures described herein have a large dimension (e.g., the largest of length, width, diameter, circumference, etc. of the mechanical resonating structure) of less than approximately 1000 microns, less than approximately 500 microns, less than approximately 100 microns, less than approximately 50 microns, or any other suitable value. As a specific example, the resonator may have at least one critical dimension (impacting the resonance frequency of the resonator) of size 500 microns or less. It should be appreciated, however, that other sizes are also possible. According to some embodiments, the devices described herein form part or all of a microelectromechanical system (MEMS).

The mechanical resonating structures may have any desired resonance frequencies and frequencies of operation, and may be configured to provide output signals of any desired frequencies. For example, the resonance frequencies and/or frequencies of operation of the mechanical resonating structures, and the frequencies of the output signals provided by the mechanical resonating structures, may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the listed frequencies are not limiting.

The mechanical resonating structures may be operated in various acoustic modes, including but not limited to Lamb waves, also referred to as plate waves including flexural modes, bulk acoustic waves, surface acoustic waves, extensional modes, translational modes and torsional modes. The selected mode may depend on a desired application of the mechanical resonating structure.

The mechanical resonating structure may be actuated and/or detected in any suitable manner, with the particular type of actuation and/or detection depending on the type of mechanical resonating structure, the desired operating characteristics (e.g., desired mode of operation, frequency of operation, etc.), or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

According to some embodiments, the mechanical resonating structures described herein may be piezoelectric Lamb wave devices, such as piezoelectric Lamb wave resonators. Such Lamb wave devices may operate based on propagating acoustic waves, with the edges of the structure serving as reflectors for the waves. For such devices, the spacing between the edges of the resonating structure may define the resonance cavity, and resonance may be achieved when the cavity is an integer multiple of p, where p=λ/2, with λ being the acoustic wavelength of the Lamb wave of interest, understanding that the device may support more than one mode of Lamb waves. However, it should be appreciated that aspects of the technology described herein apply to other types of structures as well, and that Lamb wave structures are merely non-limiting examples.

As should be appreciated from FIGS. 5A and 5B, in some embodiments suspended mechanical resonating structures are used, meaning that the mechanical resonating structure(s) may have one or more free sides or ends. Referring to FIG. 5A, the micromechanical resonating structure 510 has free ends 524 and the sides 526 are also substantially free, connected to the substrate 502 by anchors 506a and 506b.

Aspects of the present application may provide one or more benefits, non-limiting examples of which are now described. It should be appreciated that other benefits may also be realized, and that not all embodiments provide all benefits. According to some embodiments, an oscillating signal (e.g., an oscillating reference signal) is produced with an oscillator having a mechanical resonator operating in a non-linear regime. The oscillating signal may exhibit superior phase noise characteristics and/or jitter than is possible from using an oscillator with a mechanical resonator operating in a linear regime.

As an example, operating an oscillator having a mechanical resonator such that the mechanical resonator operates in a non-linear regime may result in an output signal of the oscillator exhibiting significantly improved phase noise compared to the output signal that would be produced by the same oscillator operating at the same frequency and operating the same mechanical resonator in a linear regime. In some embodiments the output signal produced by the oscillator when operating the mechanical resonator in the non-linear regime may exhibit phase noise lower by at least a factor of 2 dB than that which would be exhibited by the oscillator operating the mechanical resonator in the linear regime at the same frequency. In some embodiments, the phase noise may be lower by at least a factor of 3 dB or even 4 dB.

In some embodiments, operating an oscillator having a mechanical resonator such that the mechanical resonator operates in a non-linear regime may result in an output signal of the oscillator exhibiting significantly improved jitter compared to the output signal that would be produced by the same oscillator operating at the same frequency and operating the same mechanical resonator in a linear regime. In some embodiments the output signal produced by the oscillator when operating the mechanical resonator in the non-linear regime may exhibit jitter less than 1 picosecond, less than 100 femtoseconds, or less than 10 femtoseconds, as non-limiting examples.

Aspects of the present application may be used in connection with stand-alone devices or in various larger devices and systems. For example, aspects of the present application may be used in connection with timing oscillators, temperature compensated MEMS oscillators, oven-controlled MEMS oscillators, cellular phones, PDAs, personal computers, RFID tracking devices, GPS receivers, wireless-enabled appliances and peripherals (printers, digital cameras, household appliances), satellite radio receivers (Sirius/XM), military platforms, automobiles, land vehicles, airplanes, drones, blimps, zeppelins, ship and boats, kayaks, range finders, PNDs, laptops, tablet computers, femtocells, implantable location trackers and any location aware device.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

In addition, while some references have been incorporated herein by reference, it should be appreciated that the present application controls to the extent the incorporated references are contrary to what is described herein.

Also, various aspects described herein may be embodied as a method. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, the phraseology and terminology used herein is for the purpose of description and should not be regarded as limiting. The use of "including," "comprising," or "having," "containing," "involving," and variations thereof herein, is meant to encompass the items listed thereafter as well as additional items.

What is claimed is:

1. A method of operating a timing oscillator, the method comprising:
    driving a temperature-compensated mechanical resonator of the timing oscillator such that the temperature-compensated mechanical resonator operates in a non-linear regime and, simultaneously, maintaining a substantially constant resonance frequency of the temperature-compensated mechanical resonator while varying a temperature of the temperature-compensated mechanical resonator.

2. The method of claim 1, wherein driving the temperature-compensated mechanical resonator of the timing oscillator comprises providing an input signal to drive the temperature-compensated mechanical resonator such that an output signal of the temperature-compensated mechanical resonator has an amplitude that is a non-linear function of the input signal.

3. The method of claim 2, wherein the input signal controls a strain that drives the temperature-compensated mechanical resonator.

4. The method of claim 1, wherein driving the temperature-compensated mechanical resonator of the timing oscillator comprises driving the temperature-compensated mechanical resonator to operate in one of a plurality of stable states.

5. The method of claim 4, further comprising producing an output signal of the timing oscillator based on vibration of the temperature-compensated mechanical resonator, wherein the output signal exhibits phase noise that is at least a factor of 2 dB less than would be exhibited by an output signal of the timing oscillator if the temperature-compensated mechanical resonator was operated in a linear regime.

6. The method of claim 4, further comprising producing an output signal of the timing oscillator based on vibration of the temperature-compensated mechanical resonator, wherein the output signal exhibits jitter less than approximately 1 picosecond.

7. The method of claim 4, wherein the plurality of stable states consists of two stable states.

8. The method of claim 1, further comprising providing amplified feedback by amplifying an output signal of the temperature-compensated mechanical resonator to create an amplified signal and feeding back the amplified signal as a feedback signal to an input of the temperature-compensated mechanical resonator.

9. The method of claim 8, wherein providing amplified feedback further comprises limiting an amplitude of the feedback signal.

10. The method of claim 9, further comprising setting a phase of the feedback signal such that the timing oscillator exhibits self-sustained oscillations.

11. The method of claim 10, wherein setting the phase of the feedback signal comprises setting the phase of the feedback signal to an arbitrary value.

12. The method of claim 10, wherein setting the phase of the feedback signal comprises setting the phase of the feedback signal to be fixed in relation to a phase of an input signal to the temperature-compensated mechanical resonator.

13. The method of claim 12, wherein a relative phase difference between the input signal of the temperature-compensated mechanical resonator and the feedback signal is arbitrary.

14. The method of claim 1, further comprising actuating the temperature-compensated mechanical resonator by piezoelectric, electrostatic, or magnetic techniques.

15. The method of claim 1, further comprising detecting vibrations of the temperature-compensated mechanical resonator by piezoelectric, electrostatic, or magnetic techniques.

16. A timing oscillator comprising:
    a temperature-compensated mechanical resonator comprising a piezoelectric active layer and a multi-layer temperature compensation structure; and
    a drive circuit configured to provide an input signal to drive the temperature-compensated mechanical resonator in a non-linear regime.

17. The timing oscillator of claim 16, wherein the drive circuit is configured to provide the input signal such that an output signal of the temperature-compensated mechanical resonator has an amplitude that is a non-linear function of the input signal.

18. The timing oscillator of claim 17, wherein the drive circuit is configured to provide the input signal to control a strain that drives the temperature-compensated mechanical resonator.

19. The timing oscillator of claim 16, wherein the drive circuit is configured to provide the input signal such that the temperature-compensated mechanical resonator operates in one of a plurality of stable states.

20. The timing oscillator of claim 19, wherein the timing oscillator is configured to provide an output signal based on vibration of the temperature-compensated mechanical resonator, wherein the output signal exhibits phase noise that is at least a factor of 2 dB less than would be exhibited by an output signal of the timing oscillator if the temperature-compensated mechanical resonator was operated in a linear regime.

21. The timing oscillator of claim 19, wherein the timing oscillator is configured to provide an output signal based on vibration of the temperature-compensated mechanical resonator, wherein the output signal exhibits jitter less than approximately 1 picosecond.

22. The timing oscillator of claim 16, further comprising a feedback circuit that comprises an amplifier configured to amplify an output signal of the temperature-compensated mechanical resonator to generate an amplified signal, and a feedback connection configured to feed back the amplified signal as a feedback signal to an input of the temperature-compensated mechanical resonator.

23. The timing oscillator of claim 22, wherein the feedback circuit further comprises a limiter configured to limit an amplitude of the feedback signal.

24. The timing oscillator of claim 23, wherein the feedback circuit is further configured to set a phase of the feedback signal to an arbitrary value.

25. The timing oscillator of claim 22, wherein the timing oscillator is configured to provide an arbitrary relative phase difference between the input signal of the temperature-compensated mechanical resonator and the feedback signal.

* * * * *